(12) United States Patent
Dobyns et al.

(10) Patent No.: US 9,157,943 B2
(45) Date of Patent: Oct. 13, 2015

(54) MULTI-CHANNEL FREQUENCY DOMAIN TEST AND MEASUREMENT INSTRUMENT

(75) Inventors: Kenneth P. Dobyns, Beaverton, OR (US); Kathryn A. Engholm, Portland, OR (US); Amy M. Bergsieker, Tigard, OR (US); Steven C. Herring, Beaverton, OR (US); Gary J. Waldo, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 1169 days.

(21) Appl. No.: 12/856,467

(22) Filed: Aug. 13, 2010

(65) Prior Publication Data
US 2012/0036947 A1   Feb. 16, 2012

(51) Int. Cl.
*G01R 23/00* (2006.01)
*G01R 23/16* (2006.01)
*G01R 23/163* (2006.01)

(52) U.S. Cl.
CPC ............. *G01R 23/16* (2013.01); *G01R 23/163* (2013.01)

(58) Field of Classification Search
CPC .............................. G01R 23/16; G01R 23/163
USPC ............... 324/76.19–76.23, 555, 73.1, 76.39, 324/601, 614–615; 702/66, 76–77
See application file for complete search history.

(56) References Cited

U.S. PATENT DOCUMENTS

| | | | | |
|---|---|---|---|---|
| 3,634,759 A * | 1/1972 | Koshikawa et al. | ....... | 324/76.22 |
| 4,558,422 A * | 12/1985 | DenBeste et al. | ................ | 702/57 |
| 4,612,665 A * | 9/1986 | Inami et al. | ..................... | 381/98 |
| 4,743,844 A * | 5/1988 | Odenheimer et al. | ..... | 324/121 R |
| 5,162,723 A * | 11/1992 | Marzalek et al. | .......... | 324/76.19 |
| 6,060,878 A * | 5/2000 | Doi | ............................. | 324/76.27 |
| 6,473,701 B1 * | 10/2002 | Tallman et al. | ................. | 702/67 |
| 6,681,191 B1 * | 1/2004 | Pickerd et al. | .................. | 702/76 |
| 6,778,931 B1 * | 8/2004 | Letts et al. | ..................... | 702/117 |
| 6,892,150 B2 * | 5/2005 | Pickerd et al. | .................. | 702/67 |
| 7,271,575 B2 * | 9/2007 | Pickerd et al. | ............. | 324/76.19 |
| 7,952,344 B2 * | 5/2011 | Doi et al. | .................... | 324/76.19 |
| 8,006,195 B1 * | 8/2011 | Woodings et al. | ............. | 715/777 |
| 2004/0070386 A1 * | 4/2004 | Muto et al. | ................. | 324/76.29 |
| 2004/0095381 A1 * | 5/2004 | McDowell | ..................... | 345/740 |
| 2006/0074582 A1 * | 4/2006 | Dunsmore et al. | ............ | 702/117 |
| 2007/0027675 A1 * | 2/2007 | Hertz | .......................... | 704/200.1 |
| 2008/0144595 A1 * | 6/2008 | Nara | .............................. | 370/343 |
| 2009/0195239 A1 * | 8/2009 | Doi et al. | .................... | 324/76.19 |

(Continued)

OTHER PUBLICATIONS

MintSystems Synasys™ MS8321 Mixed—signal Waveform Analyzer Multi-channel Analog and Logic Digital Storage Oscilloscope, 2008.*

(Continued)

*Primary Examiner* — Patrick Assouad
*Assistant Examiner* — Demetrius Pretlow
(74) *Attorney, Agent, or Firm* — Michael A. Nelson; Marger Johnson

(57) ABSTRACT

A test and measurement instrument including a plurality of input ports; an acquisition system coupled to the input ports and configured to acquire frequency domain data from the input ports; a user interface configured to present frequency domain controls for at least two of the input ports; and a controller configured to adjust frequency domain acquisition parameters of the acquisition system in response to the frequency domain controls such that frequency domain acquisition parameters associated with a first input port can be different from frequency domain acquisition parameters associated with a second input port.

20 Claims, 6 Drawing Sheets

(56) References Cited

U.S. PATENT DOCUMENTS

2009/0265126 A1* 10/2009 Freidhof .................. 702/68
2011/0025297 A1*  2/2011 Sato ..................... 324/76.39

OTHER PUBLICATIONS

Hewlett Packard Service Manual Model 3585A Spectrum Analyzer, 1979.*
HP 3582A Spectrum Analyzer quick reference guide , http://web.mst.edu/~cottrell/ME240/Resources/Inst_manuals/HP_3582A_Spectrum_Analyzer_quick_reference_guide.pdf.*
Hewlett Packard Journal, http://www.hpl.hp.com/hpjournal/pdfs/IssuePDFs/1978-09.pdf.*
Digital Storage Oscilloscope , http://www.atlantec.pl/sprzet/sgl/sds1000/manual.pdf.*
Model SR785 Dynamic Signal Analyzer, http://www.thinksrs.com/downloads/PDFs/Manuals/SR785m.pdf.*
Handyscope Model HS3 A Portable 100 MS/s Instrument Connected to USB 2.0 and USB 1.1, http://neutron.physics.ucsb.edu/docs/HS3_spec.pdf.*
Basics of the Spectrum Analyzer http://www.heitman.ece.ufl.edu/4514l/manual/app_b.pdf, Jul. 2012.*
Nectar Spectrum Analysis, http://www.wimax-industry.com/sp/bvs/nectar.htm, Nectar Spectrum Analysis, Apr. 2006.*
FFT Spectrum Analyzers, http://www.upc.edu/sct/documents_equipament/d_213_id-397.pdf, Feb. 2001.*
HP 3582A Spectrum Analyzer quick reference guide , http://web.mst.edu/~cottrell/ME240/Resources/Inst_manuals/HP_3582A_Spectrum_Analyzer_quick_reference_guide.pdf, Nov. 2008.*
Hewlett Packard Journal, http://www.hpl.hp.com/hpjournal/pdfs/IssuePDFs/1978-09.pdf, Sep. 1978.*
Digital Storage Oscilloscope , http://www.atlantec.pl/sprzet/sgl/sds1000/manual.pdf , Date unknown.*
Model SR785 Dynamic Signal Analyzer, http://www.thinksrs.com/downloads/PDFs/Manuals/SR785m.pdf, Dec. 2006.*
Handyscope Model HS3 A Portable 100 MS/s Instrument Connected to USB 2.0 and USB 1.1, http://neutron.physics.ucsb.edu/docs/HS3_spec.pdf Aug. 2003.*

* cited by examiner

MULTI-CHANNEL FREQUENCY DOMAIN TEST AND MEASUREMENT INSTRUMENT

BACKGROUND

This disclosure relates to test and measurement instruments, in particular to test and measurement instruments with multiple frequency domain channels.

Electronic devices can operate with signals in multiple frequency ranges. That is, an electronic device can have baseband signals, such as digital data, and optical, microwave, or radio frequency (RF) signals, such as modulated RF and/or optical carriers. For example, baseband digital data can be used to modulate an RF carrier. Each of the baseband digital data and the modulated RF carrier can have a particular frequency spectrum.

However, bandwidths of filters, mixers, transmitters, antennae, or the like can affect the transmitted RF spectrum. As the baseband digital data and the modulated RF carrier can occupy different frequency ranges, analysis of the frequency spectra can be difficult. In particular, frequency domain test and measurement instruments typically have a single channel. Thus, comparison of the frequency spectra and, in particular, comparison of substantially time correlated frequency spectra cannot be performed.

SUMMARY

An embodiment includes a test and measurement instrument including a plurality of input ports; an acquisition system coupled to the input ports and configured to acquire frequency domain data from the input ports; a user interface configured to present frequency domain controls for at least two of the input ports; and a controller configured to adjust frequency domain acquisition parameters of the acquisition system in response to the frequency domain controls such that frequency domain acquisition parameters associated with a first input port can be different from frequency domain acquisition parameters associated with a second input port.

Another embodiment includes a method of operating a test and measurement instrument including receiving a first frequency domain control signal from a user interface, the first frequency domain control signal associated with an acquisition of a first signal; receiving a second frequency domain control signal from the user interface, the second frequency domain control signal associated with an acquisition of a second signal; and adjusting frequency domain acquisition parameters of an acquisition system in response to the first and second frequency domain control signals such that frequency domain acquisition parameters associated with the first signal are different from frequency domain acquisition parameters associated with the second signal.

DETAILED DESCRIPTION

Embodiments include test and measurement instruments and techniques where multiple frequency domain signals can be analyzed. For example, frequency domain signals with different frequency spectra from different sources can be analyzed substantially simultaneously.

Figure 1:
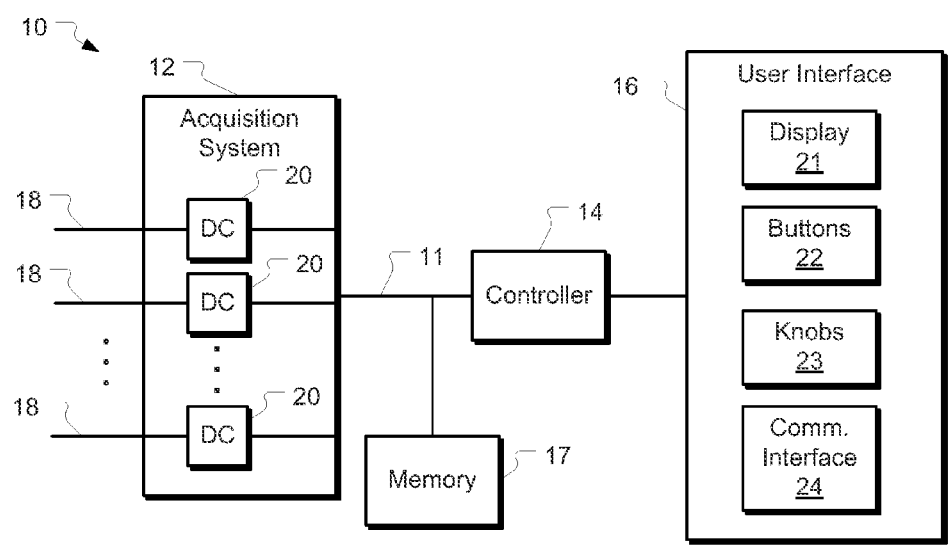
FIG. 1 is a block diagram of a multi-channel test and measurement instrument according to an embodiment.

FIG. 1 is a block diagram of a multi-channel test and measurement instrument according to an embodiment. In this embodiment, the instrument 10 includes an acquisition system 12, a controller 14, a memory 17, and a user interface 16. The acquisition system 12, memory 17, and the user interface 16 are coupled to the controller 14.

The acquisition system 12 includes multiple ports 18. A port 18 can include connectors appropriate for receiving the desired frequency range. For example, the connectors can include BNC, SMA, 2.92 mm, N, or other connectors appropriate for the desired medium.

The acquisition system 12 also includes multiple downconverters 20. As will be described in further detail below, in an embodiment, the downconverters can include multiple analog and digital components. The downconverters 20 can be configured to shift a frequency range of an input signal received through a corresponding port 18 to an intermediate frequency (IF) range. For example, a downconverter 20 can be configured to downconvert a 200 MHz wide frequency range from 2.4 GHz to 2.6 GHz to 100 to 300 MHz.

A downconverter 20 can be configured to be tunable. That is, the downconverter 20 can be tuned such that the frequency range to be downconverted can be selected. The selection can be from among discrete frequency ranges or continuous frequency ranges.

Although the term downconverter has been used, a downconverter 20 can be configured to upconvert a lower frequency range into the associated IF range. That is, by selection of local oscillator (LO) frequencies, filter bandwidths, and the like, a downconverter 20 can be configurable to convert a desired frequency range up or down into the IF frequency range.

The acquisition system 12 can be configured to acquire frequency domain data. The acquisition system 12 can be configured to store the acquired data in a memory 17. The acquisition system 12 can be configured to acquire the frequency domain data as downconverted time domain data. That is, the time domain signal at the input port 18 can be downconverted to an IF range, mixed with an in phase (I) and quadrature phase (Q) signals to generate I and Q time domain representations of the IF signal. These I and Q time domain signals can be stored in the memory 17 and later converted into the frequency domain data. That is, although the data stored in the memory 17 can be time domain data, the data represents frequency domain information of the signal input at the input port 18. In another embodiment, the I and Q time domain signals can be converted into frequency domain data before storing the data in the memory 17. For example, a Fourier transform can be performed on the I and Q signal, a combination of the signals, or the like before storing the result in the memory 17.

The instrument 10 also includes a user interface (UI) 16. The UI 16 can include a variety of different interfaces. Illustrated examples include a display 21, buttons 22, knobs 23, and a communication interface 24. Any variety of user interfaces can be used. For example, the communication interface 24 can be a wired or wireless interface, a network interface such as an Ethernet port, an infrared interface, an RF interface, or the like. The display 21 can be a CRT, an LCD, a projection, or the like. Such interfaces can be combined together. For example, a display 21 can be a touch screen allowing buttons 22 to be presented on the display 21.

Through the UI 16, a user can be presented with frequency domain controls for the input ports. For example, for a given input port 18, a user can be presented with a center frequency control, a frequency span control, a frequency start/stop control, a resolution bandwidth control, other filtering controls, such as video filtering controls, or the like. In an embodiment, frequency domain controls can be associated with each port 18. For example, the UI 16 can allow for selection of a port 18 and interpret common frequency domain controls as associated with the selected port 18. In another example, each port 18 can have dedicated frequency domain controls. Although particular examples of controls associated with frequency domain signals have been described above, the frequency domain controls can include any controls that can affect the processing, display, acquisition, or the like of frequency domain signals.

The controller 14 can be any variety of circuitry. For example, the controller 14 can include analog and digital circuitry. The controller 14 can include general purpose processors, digital signal processors, application specific integrated circuits, programmable gate arrays, or the like. The controller 14 can also include appropriate circuitry to interface with the user interface 16, the acquisition system 12, the memory 17, and the like. In an embodiment, a personal computer (PC) can include the controller 14, memory 17, UI 16, a combination of these components, or the like.

The controller 14 can be configured to adjust frequency domain acquisition parameters of the acquisition system 12 in response to the frequency domain controls. For example, frequency domain acquisition parameters associated with a first input port 18 can be set to be different from frequency domain acquisition parameters associated with a second input port 18. As described above, each port 18 can have an associated center frequency. As will be described in further detail below, a local oscillator frequency or a frequency of a similar periodic signal can be selected for each port 18 such that the digitized data in the memory 17 represents different frequency ranges; i.e. different center frequencies. Further example of differences in acquisition parameters will be given below.

The memory 17 can be any variety of memory. For example, the memory 17 can be static or dynamic. The memory 17 can include mass storage devices, such as hard disk drives, flash drives, or the like. Any device capable of storing data as acquired by the acquisition system 12 can be used as a memory 17.

Figure 2:
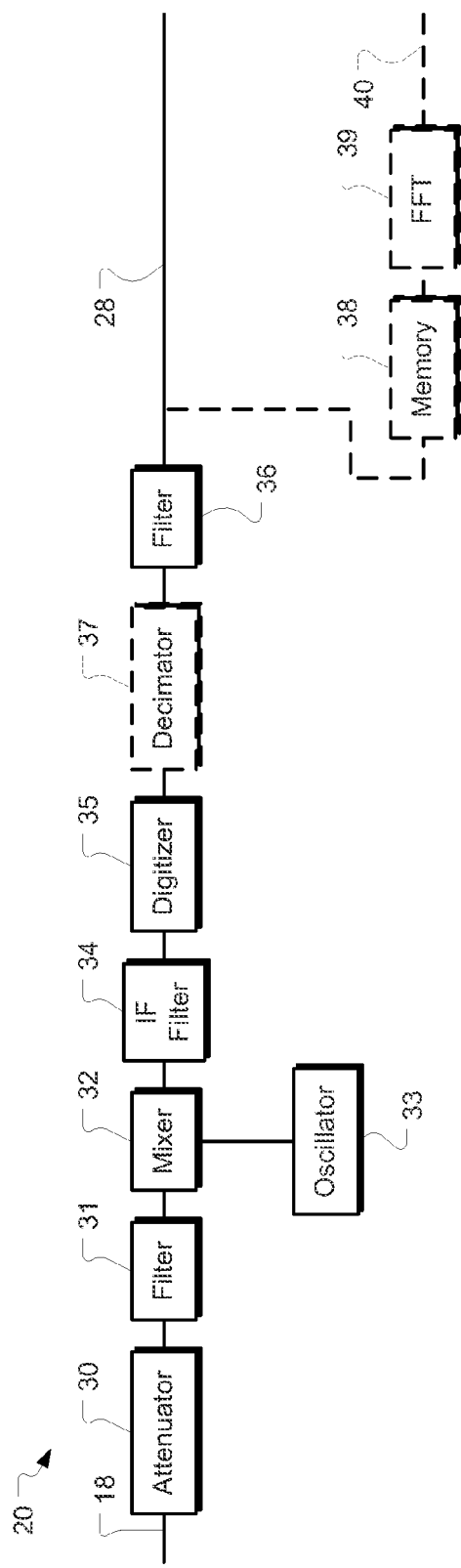
FIG. 2 is a block diagram of an example of a downconverter in the test and measurement instrument of FIG. 1.

FIG. 2 is a block diagram of an example of a downconverter in the test and measurement instrument of FIG. 1. In this example, the downconverter 20 includes an attenuator 30, a filter 31, a mixer 32, a local oscillator 33, an IF filter 34, a digitizer 35, and a digital filter 36. The input signal 18 is received by the attenuator 30. The attenuator can be a fixed attenuator, variable attenuator, switched attenuator, or the like. The attenuated signal is filtered by filter 31. In this example, the filter 31 is a band-pass filter; however, the filter can be selected as desired for the appropriate input frequency range.

The filtered signal can be downconverted to an IF range using the mixer 32 and local oscillator 33. An IF filter 34 can filter the IF signal before it is digitized by the digitizer 35, for example, an ADC. A digital filter 36 can be applied to reduce artifacts, provide a windowing function, or the like. Accordingly, the output signal 28 is available to be acquired by the acquisition system 16. Although a selection of components of the downconverter 20 has been illustrated, other components, such as amplifiers, switches, or the like can be present and/or replace illustrated components.

In an embodiment, the output signal 28 is time domain data that represents the downconverted IF signal. This IF signal can be further processed in the acquisition system 16. For example, the IF signal can be converted in to in-phase (I) and quadrature phase (Q) signals. These time domain I and Q signals can be stored in an acquisition memory 17. Further processing can be performed on the I and Q signals in the memory to obtain frequency domain data.

In another example, the IF signal 28 can be stored in a memory 38. A Fourier transform, such as a fast Fourier transform (FFT) can be performed on the IF signal, combinations of the IF signal, or the like as described above. Thus, frequency domain data 40 can be stored in the memory 38. Although the memory 38 has been described as distinct from the memory 17, the memory 38 can be part of the memory 17.

As illustrated, a decimator 37 or other decimation function can be used to reduce a number of samples of the digitized data from the digitizer 35. The decimator is illustrated as after the digitizer 35; however, the decimation can be performed at any stage in the digital processing as desired.

The downconverter 20 is an example of a downconverter of an acquisition system. The downconversion 20 can take other forms. For example, the downconversion can be performed digitally. That is, a sample rate for a digitizer can be selected to frequency shift the desired frequency range. Appropriate filtering, whether analog or digital, can be used to filter out unwanted frequency components. Accordingly, any frequency shifting circuit can be used as a downconverter 20.

The parameters of the various components of the downconverter can be adjusted according to the frequency domain controls. For example, the attenuator 30 can be adjusted in response to a vertical position/scale control. The filter 31 and oscillator 33 can be adjusted in response to a center frequency control. The filter 31, filter 34, or the like can be adjusted in response to a frequency span control. Each channel or each port 18 can have different settings. Any of the components of the acquisition system 12 can be varied on a channel by channel or port by port basis to optimize the channels for the particular frequency spectrum of interest.

Figure 3:
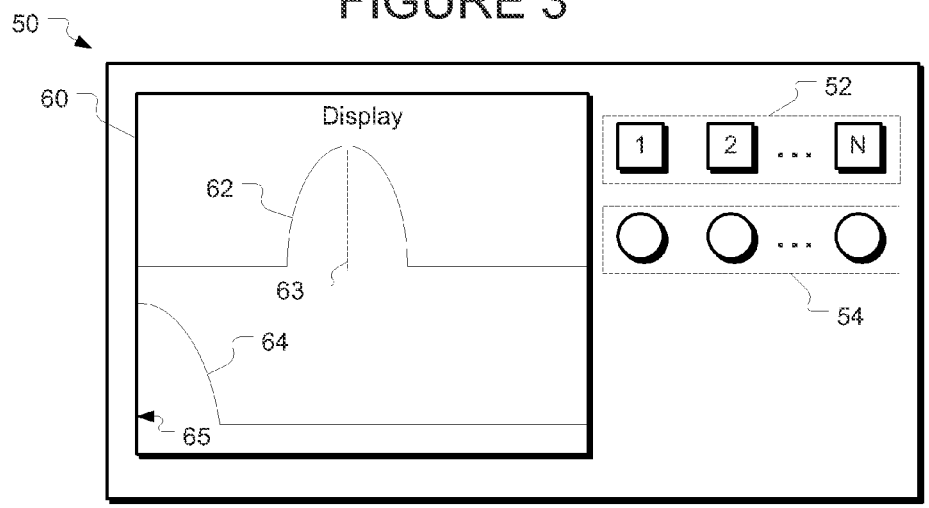
FIG. 3 is an example of a user interface of a test and measurement instrument having multiple frequency domain channels according to an embodiment.

FIG. 3 is an example of a user interface of a test and measurement instrument having multiple frequency domain channels according to an embodiment. In this embodiment, the example of the UI 50 includes a display 60, channel selectors 52, and various frequency domain controls 54, illustrated here as knobs. In this embodiment, two frequency domain signals are illustrated; however, as described above, any number can be present. For clarity, subsequent illustrations will reference two channels, controls, input, signals, or the like; however, in an embodiment, any number of such channels, signals, and controls can be present with individual interfaces, common interfaces, combinations, or the like.

A baseband signal and a modulated signal corresponding to the baseband signal can be input to input ports 18 described above. The modulated signal is displayed as trace 62. The center frequency 63 can be set to the carrier frequency associated with the modulation, the center of the spectrum, or the like. The baseband signal is represented by trace 64. In this example, a DC signal is represented on the left most edge 65 of the display.

In this example, the frequency step and/or the frequency per division of the displayed traces can be selected to be substantially similar. As a result, the spectral shapes of the baseband and modulated signals can be analyzed in similar contexts, although the signals occupy different frequency ranges. That is, the frequency span can be 200 MHz for both traces 62 and 64; however, the trace 62 is centered at 2.5 GHz, for example, while trace 64 is centered at 100 MHz.

In an embodiment, the acquisition parameters used to acquire the baseband and modulated signals can be selected appropriately to the particular signal and, if desired can be different. For example, a downconversion local oscillator frequency, sampling rates, filter positions, or the like can be selected to downconvert the modulated signal to an appropriate frequency range for acquisition of frequencies within a desired span centered on center frequency 63. In contrast, with the baseband signal, downconversion may not be used. For example, a discrete Fourier transform can be performed on the acquired data to generate the trace 64.

Although a baseband signal as been used as an example of a signal associated with a modulated signal, the signal need not be a baseband signal. For example, the associated signal input on a different port 18 could be an IF signal that is upconverted to generate the modulated signal represented by trace 62. Thus, both traces 62 and 64 could represent signals that are downconverted during acquisition, however, the signals associated with traces 62 and 64 can be acquired using different downconversion frequencies.

Figure 4:
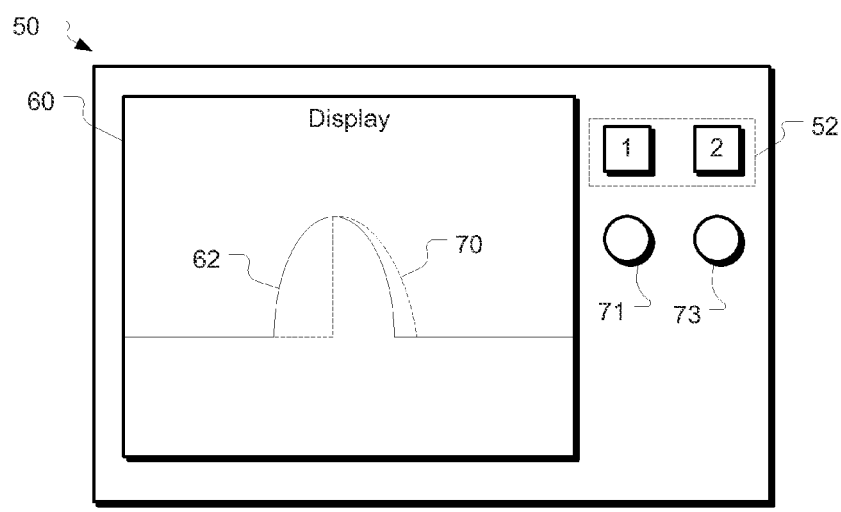
FIG. 4 is an example of a user interface of a test and measurement instrument having multiple frequency domain channels with offset center frequencies according to an embodiment.

FIG. 4 is an example of a user interface of a test and measurement instrument having multiple frequency domain channels with offset center frequencies according to an embodiment. In an embodiment, the controls 54 can include center frequency controls. A first center frequency control 71 can control the center frequency of trace 62. A second center frequency control 73 can control the center frequency of trace 70. In this example, trace 70 is a shifted version of trace 64 from FIG. 3. Thus, by manipulating the center frequencies associated with each trace 62 and 70, the frequency content of the signals can be analyzed The user interface 50 can also include other position related controls. For example, the UI 50 can include vertical scale controls, vertical position controls, or the like for each trace 62 and 70. In this example, the vertical positions and scales have been set such that the signal overlap. Accordingly, an effect of the modulation resulting in trace 62 from trace 70 can be analyzed.

Although the terms vertical position and scale have been used, such controls can have different meanings in the context of frequency domain analysis. For example, frequency domain analysis can be performed with a logarithmic-based vertical axis. Accordingly, the vertical position control can correspond to a reference level control and the vertical scale control can correspond to dB per division control. Accordingly, vertical scale and position controls can be configured to have an affect that is appropriate to the particular presentation of the traces 62 and 70.

Figure 5:
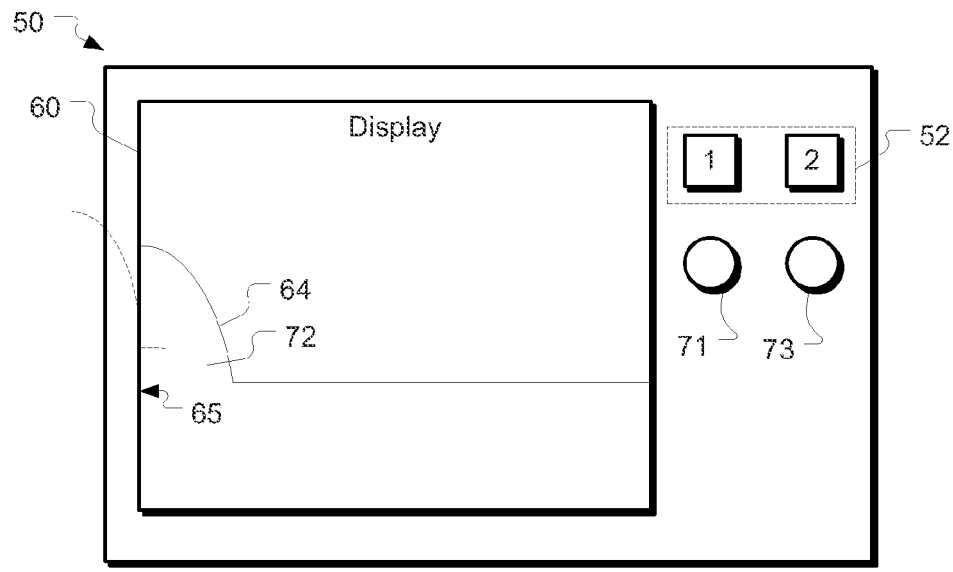
FIG. 5 is another example of a user interface of a test and measurement instrument having multiple frequency domain channels with offset center frequencies according to an embodiment.

FIG. 5 is another example of a user interface of a test and measurement instrument having multiple frequency domain channels with offset center frequencies according to an embodiment. In this example, the modulated signal represented by trace 72 is shifted, in contrast to the traces of FIG. 4. Trace 72 represents the trace 62 of FIG. 3. The center frequency of trace 62 can be moved such that the carrier frequency aligns with the left edge 65 of the display 60. Accordingly, the corresponding portion of the trace 72 representing the modulated signal can be analyzed as if it is the source baseband signal.

Although the trace 72 has been illustrated as one sideband of the trace 62 of FIG. 3, any sideband can be presented. For example, the frequency domain controls of the user interface 50 can include a control to invert the frequency axis for trace 72. For example, a frequency of a local oscillator can be changed to position a different sideband in the IF frequency range, filter positions can be changed, or the like. Accordingly, the different sideband can be compared with the baseband signal represented by trace 64.

Figure 6:
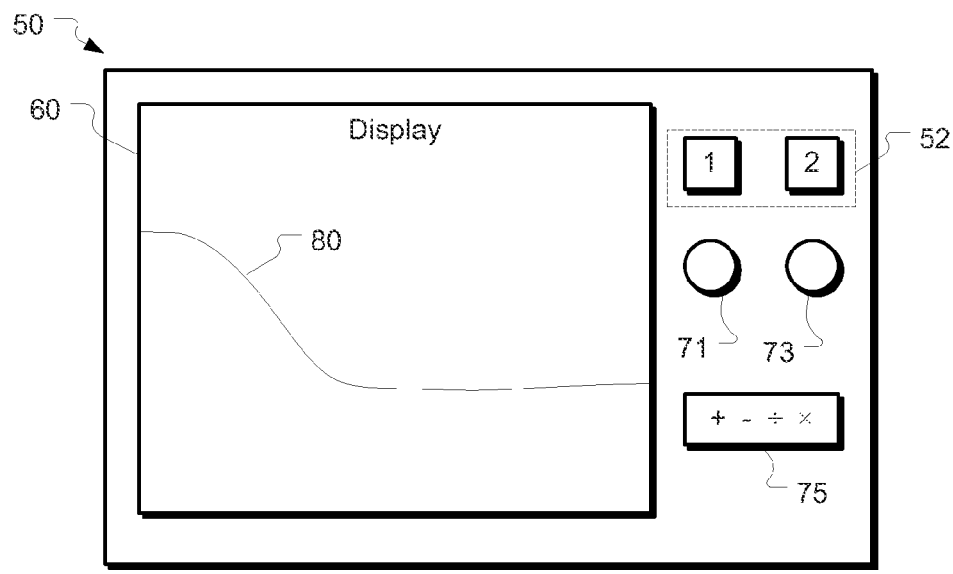
FIG. 6 is an example of a user interface of a test and measurement instrument having multiple frequency domain data combined together according to an embodiment.

FIG. 6 is an example of a user interface of a test and measurement instrument having multiple frequency domain data combined together according to an embodiment. In an embodiment, the user interface 50 can include a channel function interface 75. The channel function interface 75 can be used to combine frequency domain data together to create a new trace. Although the channel function interface 75 has been illustrated with symbols representing addition, subtraction, division, and multiplication, any function can be performed on the acquired signals.

In this example, the traces of FIG. 5 have been combined together to create a transfer function 80. The transfer function 80 can represent the amplitude transfer function from the baseband signal represented by trace 64 of FIG. 5 and the modulated sideband represented by trace 72 of FIG. 5. Accordingly, a user can analyze the effects of the modulation, filtering, or the like.

Although various examples have been given in the context of a baseband signal and a modulated signal, the various acquired signal can represent signals in any stage of signal processing or from any device. For example, the modulated signal can be a received RF signal while the baseband signal is the demodulated signal. In another example, the baseband signal can be digital data from a transmitter.

Figure 7:
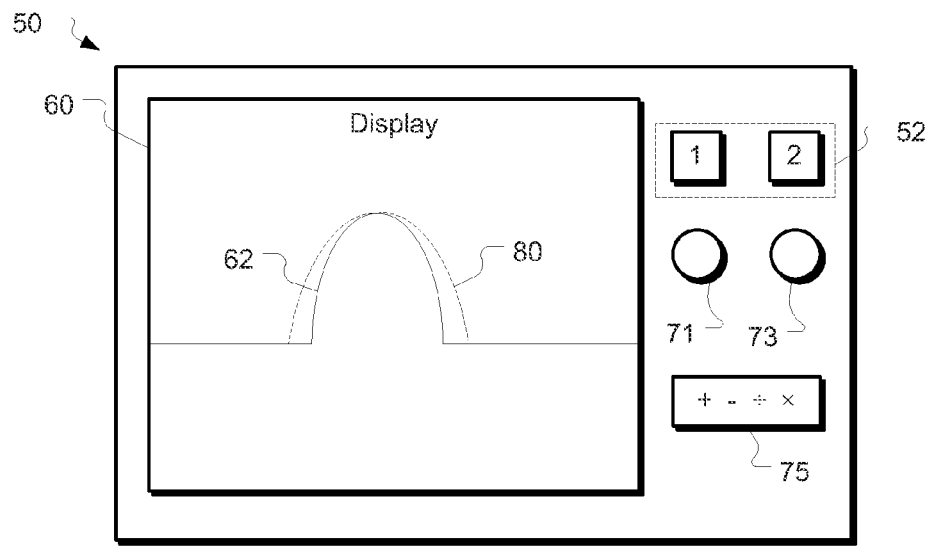
FIG. 7 is an example of a user interface of a test and measurement instrument having functions of multiple frequency domain channels according to an embodiment.

FIG. 7 is an example of a user interface of a test and measurement instrument having functions of multiple frequency domain channels according to an embodiment. In this embodiment, trace 62 represents the modulated signal of FIG. 3. Trace 80 is the baseband signal represented by trace 64 of FIG. 3, mathematically modulated for comparison with the actual acquired modulated signal. That is, through the channel function interface 75, the user can select a modulation function, a carrier, or the like to present the baseband data in the context of the modulated signal of trace 64.

Although various functions have been illustrated, any function can be performed on one or more of the traces. For example, a phase transfer function can be calculated. Thus, phase related effects of the modulation can be analyzed. I-Q modulation can be performed using two acquired signals for comparison with the actual I-Q modulated signal of a third acquired signal. Any combination of function can be performed.

Figure 8:
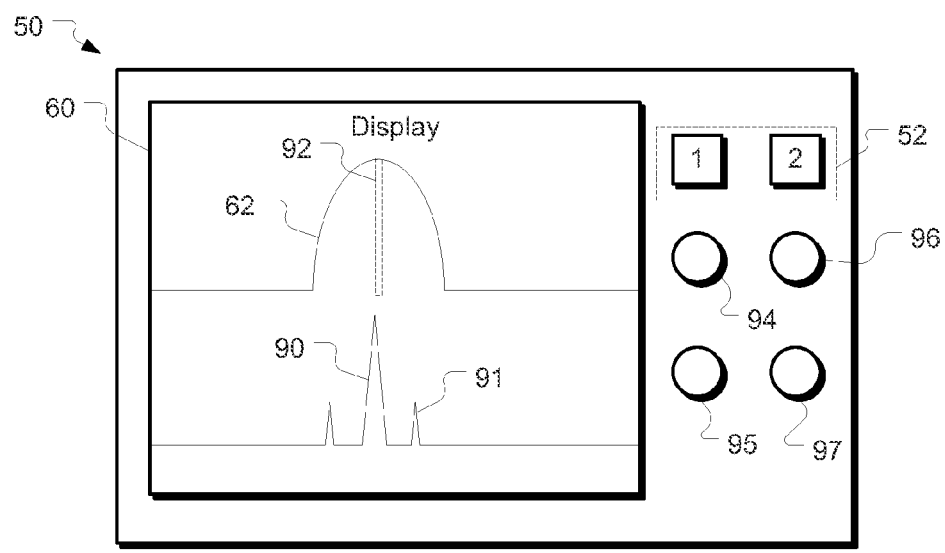
FIG. 8 is an example of a user interface of a test and measurement instrument having multiple frequency domain channels with different frequency spans according to an embodiment.

FIG. 8 is an example of a user interface of a test and measurement instrument having multiple frequency domain channels with different frequency spans according to an embodiment. In the above examples, the frequency span was substantially identical. Accordingly, the frequencies of the traces can be compared on a one to one basis.

However, in an embodiment, other portions of a signal can be of interest. For example, jitter, noise, or the like on the carrier can be analyzed. Trace 62 again represents the modulated signal. Trace 90 represents the same modulated signal; however, the frequency span of the traces is different. That is, the frequency span of trace 90 occupies the range illustrated by selection 92. Accordingly, frequency components near the carrier frequency that may otherwise have been obscured can be analyzed.

In an embodiment, the signals associated with traces 62 and 90 can be acquired in different ways. For example, the same signal can be split and input to two ports 18 of the instrument 10. In another example, a single port 18 can be associated with multiple downconverters 20. Regardless, the frequency domain acquisition parameters associated with each trace 62 and 90 can be varied differently.

In an embodiment, the acquired frequency span can be different. For example, each trace 62 and 90 can be associated with a separate frequency span controls 94 and 96. In response to the frequency span controls 94 and 96, various aspects of the downconverting can be adjusted. For example, the sample rate of the digitizer 35 can be changed, filter bandwidths can be changed, or the like to establish the desired frequency span. However, the presentation of the trace can, but need not, present all of the acquired data. That is, the acquisition system 12 could acquire data sufficient for a larger frequency span; however, the data that is presented as trace 90 is a subset of that span. That is, the presented data and the acquisition parameters can be adjusted as desired to present the particular frequency span.

In an embodiment, a change in frequency span can be associated with a change in resolution bandwidths. For example, as the frequency span is reduced, the resolution bandwidth can be correspondingly reduced such that frequency components with smaller separations can be resolved.

In an embodiment, the user interface can include a first resolution bandwidth control 95 and a second resolution bandwidth control 97. The controller can be configured to present a first frequency spectrum on the display in response to the first resolution bandwidth control 95 and to present a second frequency spectrum on the display in response to the second resolution bandwidth control 97.

In an embodiment, the resolution bandwidth associated with the frequency spectrum can be different. For example, the resolution bandwidth associated with trace 90 can be lower than the resolution bandwidth associated with trace 62. As a result, frequency components, such as the component 91 of trace 90 can be resolved. In contrast, such components would not be visible at the resolution bandwidth associated with trace 62.

In an embodiment, various aspects of acquisition can be adjusted to accommodate the resolution bandwidth. For example, referring to FIGS. 1 and 2, acquisition system 12 can be configured to sample for a longer time span. That is, a time over which data is acquired can be changed, a length of acquired data representing a particular time span can be changed, or the like. In another example, the digitizer 35 could sample using a lower sample rate. In another example, a different decimation technique can be used. That is, the digitizer 35 could sample at a higher sample rate; however, the decimation can be changed to further reduce the number of samples. Any combination of such changes to acquisitions can be used.

Figure 9:
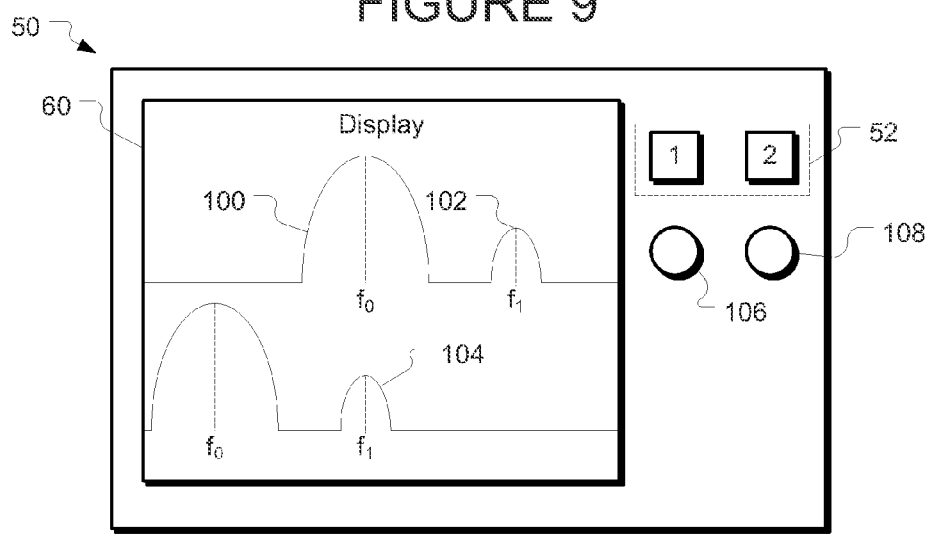
FIG. 9 is an example of a user interface of a test and measurement instrument having multiple frequency domain channels with different center frequencies according to an embodiment.

FIG. 9 is an example of a user interface of a test and measurement instrument having multiple frequency domain channels with different center frequencies according to an embodiment. In this embodiment, the user interface 50 includes a first center frequency control 106 and a second center frequency control 108. The controller 14 is configured to adjust the frequency domain acquisition parameters associated with the first trace 100 in response to the first center frequency control 106 and to adjust the frequency domain acquisition parameters associated with the second trace 104 in response to the second center frequency control 108.

In this example, trace 100 includes a sideband 102. A first spectrum of trace 100 is centered at frequency $f_0$. The sideband 102 is centered at frequency $f_1$. Trace 104 represents the sideband 102 with the center frequency associated with the trace 104 different from that of trace 100. That is, in this example, frequency $f_0$ of trace 100 is centered in the display 60 in response to the first center frequency control 106 and frequency $f_1$ of trace 104 is centered in the display 60 in response to the second center frequency control 108.

In an embodiment, the frequency domain acquisition parameters can be adjusted in response to the center frequency controls 106 and 108. For example, referring to FIG. 2, as the second center frequency control 108 is adjusted, a downconversion frequency of the oscillator 33 can be increased to center frequency f1 of trace 104. Furthermore, as described above, the frequency span can be adjusted as desired to further examine the trace 104.

Although the presentation of frequency domain signals has been described with respect to an amplitude versus frequency display, other frequency domain display techniques can be used as desired. For example, a constellation view of a 16 quadrature-amplitude-modulated (QAM) signal can be acquired and displayed along with a mathematically created 16-QAM signal created from source I and Q input signals. That is, frequency domain signals from different sources, different stages of processing, or the like can be analyzed in the same context.

Although particular embodiments have been described, it will be appreciated that the principles of the invention are not limited to those embodiments. Variations and modifications may be made without departing from the principles of the invention as set forth in the following claims.

The invention claimed is:

1. A test and measurement instrument, comprising:
    a plurality of input ports;
    an acquisition system coupled to the input ports and configured to simultaneously acquire frequency domain data from the input ports;
    a user interface configured to simultaneously present separate frequency domain controls for at least two of the Input ports; and
    a controller configured to adjust frequency domain acquisition parameters of the acquisition system in response to the frequency domain controls such that frequency domain acquisition parameters associated with a first input port can be different from frequency domain acquisition parameters associated with a second input port.

2. The test and measurement instrument of claim 1, wherein:
    the user interface includes:
    a display;
    a first vertical position control; and
    a second vertical position control; and
    the controller is configured to present a first frequency spectrum on the display in response to the first vertical position control and to present a second frequency spectrum on the display in response to the second vertical position control.

3. The test and measurement instrument of claim 1, wherein:
the user interface includes:
a display;
a first vertical scale control; and
a second vertical scale control; and
the controller is configured to present a first frequency spectrum on the display in response to the first vertical scale control and to present a second frequency spectrum on the display in response to the second vertical scale control.

4. The test and measurement instrument of claim 1, wherein:
the user interface includes:
a display;
a first center frequency control; and
a separate second center frequency control; and
the controller is configured to present a first frequency spectrum on the display in response to the first center frequency control and to present a second frequency spectrum on the display in response to the second center frequency control.

5. The test and measurement instrument of claim 1, wherein:
the user interface includes:
a display;
a first frequency span control; and
a separate second frequency span control; and
the controller is configured to present a first frequency spectrum on the display in response to the first frequency span control and to present a second frequency spectrum on the display in response to the second frequency span control.

6. The test and measurement instrument of claim 1, wherein:
the user interface includes:
a display;
a first resolution bandwidth control; and
a separate second resolution bandwidth control; and
the controller is configured to present a first frequency spectrum on the display in response to the first resolution bandwidth control and to present a second frequency spectrum on the display in response to the second resolution bandwidth control.

7. The test and measurement instrument of claim 1, wherein:
the user interface includes:
a first center frequency control; and
a separate second center frequency control; and
the controller is configured to adjust the frequency domain acquisition parameters associated with the first port in response to the first center frequency control and to adjust the frequency domain acquisition parameters associated with the second port in response to the second center frequency control.

8. The test and measurement instrument of claim 7, wherein the controller is configured to change a downconversion frequency associated with the first port in response to the first center frequency control and change a second downconversion frequency associated with the second port in response to the second center frequency control.

9. The test and measurement instrument of claim 1, wherein:
the user interface includes:
a first frequency span control; and
a separate second frequency span control; and
the controller is configured to adjust the frequency domain acquisition parameters associated with the first port in response to the first frequency span control and to adjust the frequency domain acquisition parameters associated with the second port in response to the second frequency span control.

10. The test and measurement instrument of claim 9, wherein the controller is configured to change a first sample rate associated with the first port in response to the first frequency span control and change a second sample rate associated with the second port in response to the second frequency span control.

11. The test and measurement instrument of claim 1, wherein:
the user interface includes:
a first resolution bandwidth control; and
a separate second resolution bandwidth control; and
the controller is configured to adjust the frequency domain acquisition parameters associated with the first port in response to the first resolution bandwidth control and to adjust the frequency domain acquisition parameters associated with the second port in response to the second resolution bandwidth control.

12. The test and measurement instrument of claim 11, wherein the controller is configured to change a first acquired time span associated with the first port in response to the first resolution bandwidth control and change a second acquired time span associated with the second port in response to the second resolution bandwidth control.

13. The test and measurement instrument of claim 1, wherein:
the user interface includes a function interface; and
the controller is configured to combine frequency domain data associated with the first port with frequency domain data associated with the second port in response to the function interface.

14. A method of operating a test and measurement instrument, comprising:
receiving a first frequency domain control signal from a user interface, the first frequency domain control signal associated with an acquisition of a first signal;
simultaneous with receiving the first frequency domain control signal, receiving a second frequency domain control signal from the user interface, the second frequency domain control signal associated with an acquisition of a second signal; and
adjusting frequency domain acquisition parameters of an acquisition system in response to the first and second frequency domain control signals using separate controls such that frequency domain acquisition parameters associated with the first signal are different from frequency domain acquisition parameters associated with the second signal.

15. The method of claim 14, wherein:
the first frequency domain control includes a first center frequency control signal and;
further comprising changing the frequency domain acquisition parameters associated with the first signal in response to the first center frequency control signal.

16. The method of claim 15, wherein changing the frequency domain acquisition parameters associated with the first signal in response to the first center frequency control signal comprises changing a downconversion frequency associated with the first signal in response to the first center frequency control.

17. The method of claim 14, wherein:
the first frequency domain control includes a first frequency span control signal; and
further comprising changing the frequency domain acquisition parameters associated with the first signal in response to the first frequency span control signal.

18. The method of claim 17, wherein changing the frequency domain acquisition parameters associated with the first signal in response to the first frequency span control signal comprises changing a sampling rate associated with the first signal in response to the first frequency span control signal.

19. The method of claim 14, wherein:
the first frequency domain control includes a first resolution bandwidth control signal; and
further comprising changing the frequency domain acquisition parameters associated with the first signal in response to the first resolution bandwidth control signal.

20. The method of claim 19, wherein changing the frequency domain acquisition parameters associated with the first signal in response to the first resolution bandwidth control signal comprises changing an acquired time span associated with the first signal in response to the first resolution bandwidth control signal.

* * * * *